(12) United States Patent
Seo

(10) Patent No.: US 11,652,309 B2
(45) Date of Patent: *May 16, 2023

(54) BOARD COUPLING STRUCTURE WITH SEPARATE POWER SUPPLY CIRCUIT BOARD

(71) Applicant: SOLUM CO., LTD, Yongin-si (KR)

(72) Inventor: Chang Min Seo, Osan-si (KR)

(73) Assignee: SOLUM CO., LTD, Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/546,633

(22) Filed: Dec. 9, 2021

(65) Prior Publication Data

US 2022/0102882 A1 Mar. 31, 2022

Related U.S. Application Data

(63) Continuation of application No. 16/865,814, filed on May 4, 2020, now Pat. No. 11,239,585.

(30) Foreign Application Priority Data

May 31, 2019 (KR) .......................... 10-2019-0064744

(51) Int. Cl.
*H01R 12/00* (2006.01)
*H01R 12/70* (2011.01)
(Continued)

(52) U.S. Cl.
CPC .......... *H01R 12/7082* (2013.01); *H01R 12/52* (2013.01); *H01R 12/58* (2013.01); *H01R 12/722* (2013.01); *H01R 12/7088* (2013.01)

(58) Field of Classification Search
CPC ............ H01R 12/7082; H01R 12/7088; H01R 12/722; H01R 12/58; H01R 12/52
(Continued)

(56) References Cited

U.S. PATENT DOCUMENTS 7,944,708 B2 5/2011 Lin
8,934,257 B1 1/2015 Reynov et al.
(Continued)

FOREIGN PATENT DOCUMENTS

GB 2251128 6/1992
JP 2006135850 5/2006
(Continued)

OTHER PUBLICATIONS

European Search Report—European Application No. 20173719.4 dated Oct. 14, 2020, citing JP 2011-108853, GB 2251128, U.S. Pat. No. 8,934,257, US 2009/0244871, and WO 2008/101564.
(Continued)

*Primary Examiner* — Khiem M Nguyen

(74) *Attorney, Agent, or Firm* — Cantor Colburn LLP

(57) ABSTRACT

Provided is a board coupling structure in which a power supply circuit board is formed as a separate board, more specifically, to a board coupling structure in which a signal processing circuit board for processing signals such as image signals, voice signals, and the like and a power supply circuit board are formed as different types of boards and the different types of boards are laterally coupled to each other. The board coupling structure includes a first circuit board, a second circuit board formed of a smaller number of layers than the number of layers of the first circuit board, and a fastening unit configured to laterally fasten a contact edge of the first circuit board to a contact edge of the second circuit board which are facing each other.

11 Claims, 18 Drawing Sheets

(51) Int. Cl.
    *H01R 12/52*        (2011.01)
    *H01R 12/58*        (2011.01)
    *H01R 12/72*        (2011.01)

(58) Field of Classification Search
    USPC ..................................................... 439/65–75
    See application file for complete search history.

(56)                References Cited

U.S. PATENT DOCUMENTS 11,239,585 B2 *   2/2022   Seo ..................... H01R 12/722
   2009/0244871 A1  10/2009   Lin

FOREIGN PATENT DOCUMENTS

JP        2011108853      6/2011
   JP        2017034302      2/2017
   KR        20180091169     8/2018
   WO        2008101564      8/2008

OTHER PUBLICATIONS

Korean Office Action—Korean Application No. 10-2019-0064744 dated Jan. 27, 2021, citing KR 10-2018-0091169, JP 2017-034302, and JP 2006-135850.

* cited by examiner

PRIOR ART

BOARD COUPLING STRUCTURE WITH SEPARATE POWER SUPPLY CIRCUIT BOARD

BACKGROUND

Field

Embodiments of the inventive concept relate to a board coupling structure in which a power supply circuit board is formed as a separate board. More specifically, embodiments of the inventive concept relate to a board coupling structure in which a signal processing circuit board for processing signals such as image signals, voice signals, or the like and a power supply circuit board are formed as different types of boards and the different types of boards are laterally coupled to each other.

Description of Related Art

Conventionally, a signal processing circuit for processing image signals and/or voice signals and a power supply circuit for supplying necessary power are divided and disposed in separate regions on a single board.

FIG. 1 is a view illustrating a conventional printed circuit board (PCB) structure. A single board 10 is divided into a signal processing circuit region 11 and a power supply circuit region 12 and necessary circuits and elements are disposed in each of the regions. Generally, a board has a multi-layer structure of three or more layers in order to reduce an area of a circuit region.

However, forming a circuit board including a signal processing circuit and a power supply circuit as a board having a multi-layer structure causes an increase in cost of the board. In addition, depending on product specifications for the signal processing circuit portion or the power supply circuit portion, a change inevitably occurs in an area occupied by the corresponding circuit or in circuit arrangement. In this case, there is a problem in that an area change in the entire board or a change in circuit layout is caused so that an increase in cost occurs.

SUMMARY

Embodiments of the inventive concept provide a board coupling structure in which a signal processing circuit board and a power supply circuit board are formed as different types of boards and the boards are coupled to each other to operate as a single board, thereby reducing board production cost and preventing or minimizing a change in circuit layout or a change in area of one board according to a change in circuit layout or a change in area of the other board.

The technical objectives of the inventive concept are not limited to the above disclosure; other objectives may become apparent to those of ordinary skill in the art based on the following descriptions.

In accordance with an aspect of the inventive concept, a board coupling structure includes a first circuit board, a second circuit board formed of a smaller number of layers than the number of layers of the first circuit board, and a fastening unit configured to laterally fasten a contact edge of the first circuit board to a contact edge of the second circuit board which are facing each other.

In an embodiment, the fastening unit may be provided with two or more fasteners spaced apart from each other.

In an embodiment, each of the two or more fasteners may include an upper piece configured to cross an upper or lower boundary between the first circuit board and the second circuit board, and two insertion pieces which are bent and extend from opposite sides of the upper piece toward the boards and are inserted into a first fastener insertion hole formed in the first circuit board and into a second fastener insertion hole formed in the second circuit board.

In an embodiment, of the two or more fasteners, two fasteners may be formed as a pair of fasteners and may be supported by one support that crosses the upper or the lower boundary between the first circuit board and the second circuit board.

In an embodiment, the board coupling structure may further include at least one electrical connector configured to electrically connect the first circuit board to the second circuit board.

In an embodiment, the electrical connector may be disposed between the fasteners, pins located at one side of the electrical connector may be inserted into first insertion holes formed in the first circuit board, pins located at the other side of the electrical connector may be inserted into second insertion holes formed in the second circuit board, and the pins located at the one side may be electrically connected to the pins located at the other side which correspond to the pins located at the one side.

In an embodiment, the electrical connector may be disposed between the pair of fasteners, pins located at one side of the electrical connector may be inserted into first insertion holes formed in the first circuit board, pins located at the other side of the electrical connector may be inserted into second insertion holes formed in the second circuit board, and the pins located at the one side may be electrically connected to the pins located at the other side which correspond to the pins located at the one side.

In an embodiment, the first circuit board may be a circuit board of three or more layers, and the second circuit board may be a single-layer circuit board or a two-layer circuit board.

In an embodiment, the first circuit board may be a signal processing circuit board for processing an image signal and/or a voice signal, and the second circuit board may be a power supply circuit board for supplying power to the first circuit board.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Hereinafter, configurations and operations of embodiments of the inventive concept will be described in detail with reference to the accompanying drawings.

FIG. 2 shows views for describing a board coupling structure in accordance with an embodiment of the inventive concept.

Figure 1:
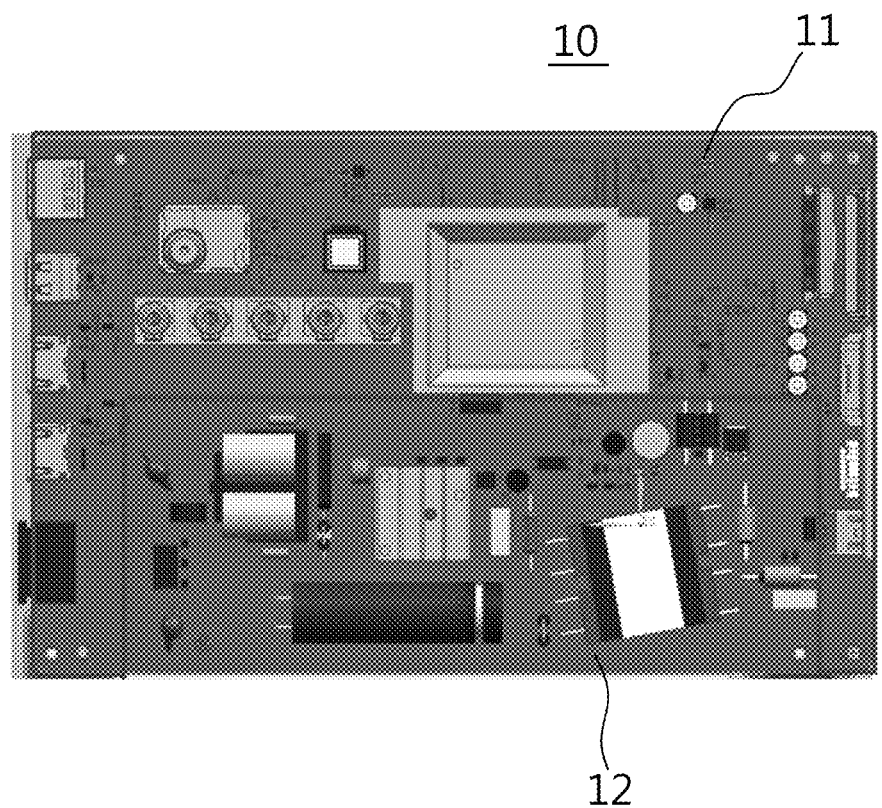
FIG. 1 is a view illustrating a conventional printed circuit board (PCB) structure.
Figure 2A:
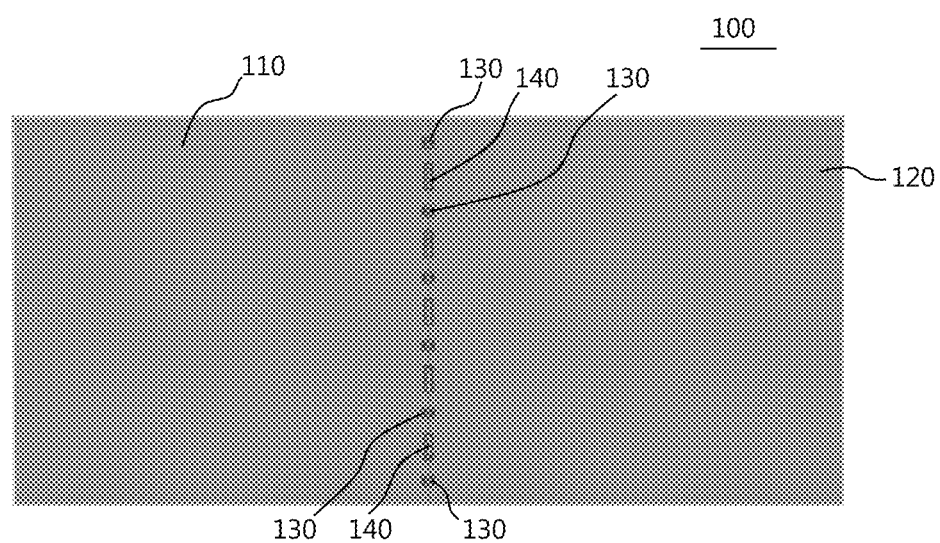
FIG. 2A shows an overall appearance of the board coupling structure in accordance with an embodiment of the inventive concept.
Figure 2B:
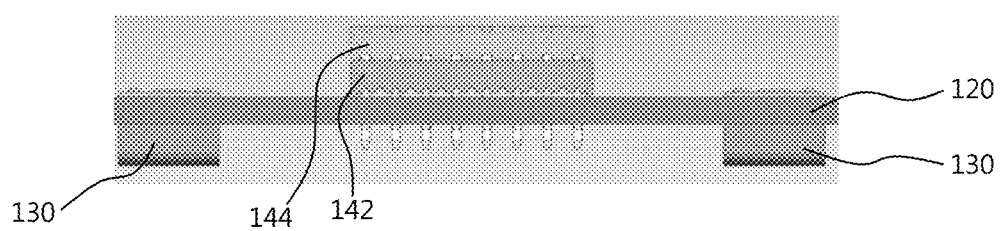
FIG. 2B is a side view of coupling components.
Figure 2C:
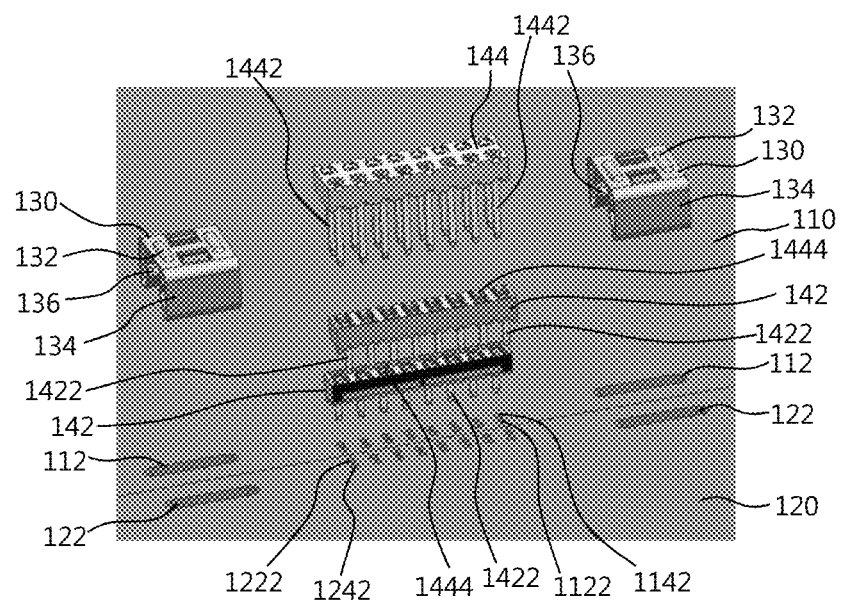
FIG. 2C is an exploded perspective view of the coupling components.
Figure 2D:
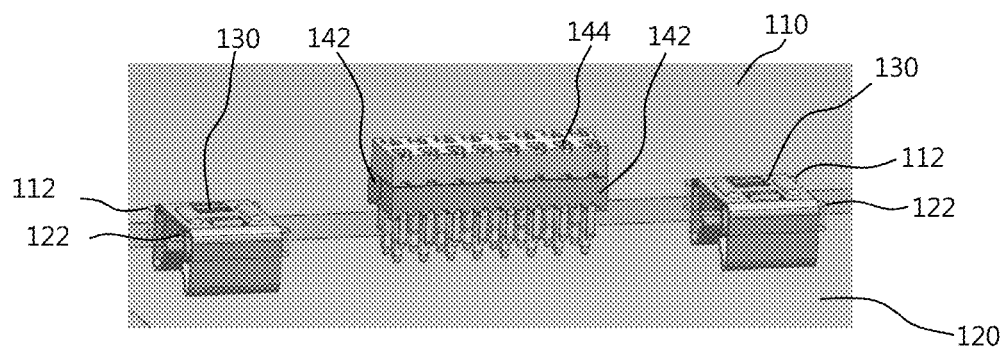
FIG. 2D is a perspective view of the coupling components.

FIG. 2A shows an overall appearance of the board coupling structure, FIG. 2B is a side view of coupling components, FIG. 2C is an exploded perspective view of the coupling components, and FIG. 2D is a perspective view of the coupling components.

Referring to FIG. 2, a board coupling structure 100 may include a first circuit board 110, which is a signal processing circuit board, for processing image signals and/or voice signals, a second circuit board 120 which is a power supply circuit board, fasteners 130 for physically coupling the two boards, and electrical connectors 140 for electrically connecting the two boards.

Elements or modules for processing image signals and/or voice signals are disposed on the first circuit board 110 and the elements or modules are omitted for convenience of description.

The first circuit board 110 may be a printed circuit board (PCB) of three or more layers. In some cases, the first circuit board 110 may be a two-layer PCB.

First fastener insertion holes 112 for inserting the fasteners 130 may be formed in an edge, which faces the second circuit board 120, of the first circuit board 110.

First socket insertion holes 1142 for inserting pins 1422 of a socket 142 may be formed in the edge, which faces the second circuit board 120, of the first circuit board 110.

First connector insertion holes 1122 for inserting pins 1442, which are located at the first circuit board, of a connector header 144 may be formed in the edge, which faces the second circuit board 120, of the first circuit board 110.

Elements or modules for providing necessary power to the first circuit board 110 are disposed on the second circuit board 120 and the elements or modules are omitted for convenience of description.

The second circuit board 120 may be a single-layer PCB or a two-layer PCB.

Second fastener insertion holes 122 for inserting the fasteners 130 may be formed in an edge, which faces the first circuit board 110, of the second circuit board 120.

Second socket insertion holes 1242 for inserting pins 1422 of socket 142 may be formed in the edge, which faces the first circuit board 110, of the second circuit board 120.

Second connector insertion holes 1222 for inserting pins 1442, which are located at the second circuit board, of the connector header 144 may be formed in the edge, which faces the first circuit board 110, of the second circuit board 120.

The fastener 130 may include an upper piece 132 crossing a boundary between the first circuit board 110 and the second circuit board 120, and two insertion pieces 134 which are bent and extend from opposite sides of the upper piece 132 and are inserted into the first fastener insertion hole 112 and the second fastener insertion hole 122.

Locking steps 136 locking on one side of the first fastener insertion hole 112 and one side of the second fastener insertion hole 122 may be formed at ends of the insertion pieces 134.

The fastener 130 laterally fastens the first circuit board 110 to the second circuit board 120 to be pressed against each other from edge to edge.

The fastener 130 may be made of an elastic metal material or a synthetic resin material.

The electrical connector 140 may include two sockets 142, which are inserted and coupled to respective upper surfaces of the circuit boards, and a connector header 144 which is inserted and coupled to upper sides of the two sockets 142 facing each other.

The pins 1422 of one socket 142 may be inserted into the first socket insertion holes 1142. Pin through-holes 1444 may be formed in an upper surface of the socket 142, wherein the pins 1442, which are located at the first circuit board, of the connector header 144 are inserted into and pass through the pin through-holes 1444. The pins 1422 of the socket may be electrically connected to the pins 1442, which are located at the first circuit board, of the connector header in the pin through-holes 1444.

The pins 1422 of the other socket 142 may be inserted into the second socket insertion holes 1242. Pin through-holes 1444 may be formed in an upper surface of the other socket 142, wherein the pins 1442, which are located at the second circuit board, of the connector header 144 are inserted into and pass through the pin through-holes 1444. The pins 1422 of the other socket may be electrically connected to the pins 1442, which are located at the second circuit board, of the connector header in the pin through-holes 1444.

The pins 1442, which are located at the first circuit board, of the connector header 144 are electrically connected to the pins 1442, which are located at the second circuit board, of the connector header 144.

The pins 1442, which are located at the first circuit board, of the connector header 144 are inserted into and pass through the pin through-holes 1444 of one socket 142 and are inserted into the first connector insertion holes 1122. The pins 1442, which are located at the second circuit board, of the connector header 144 are inserted into and pass through the pin through-holes 1444 of the other socket 142 and are inserted into the second connector insertion holes 1222.

The first circuit board 110 and the second circuit board 120 are electrically connected to each other through the connector header 144.

An assembly process of the board coupling structure in accordance with the present embodiment is as follows.

First, after the socket 142 is mounted on the first circuit board, reflow soldering is performed on an upper surface of the first circuit board, and after the socket 142 is mounted on the second circuit board, reflow soldering is performed on an upper surface of the second circuit board.

Next, after insertion components are mounted on each of the circuit boards on which the reflow soldering is performed, flow soldering is performed.

Next, after the first circuit board and the second circuit board are fixed on a jig, the fasteners and the connector header are assembled on each circuit board so that the boards are coupled to each other.

FIG. 3 shows views for describing a board coupling structure in accordance with another embodiment of the inventive concept.

Figure 3A:
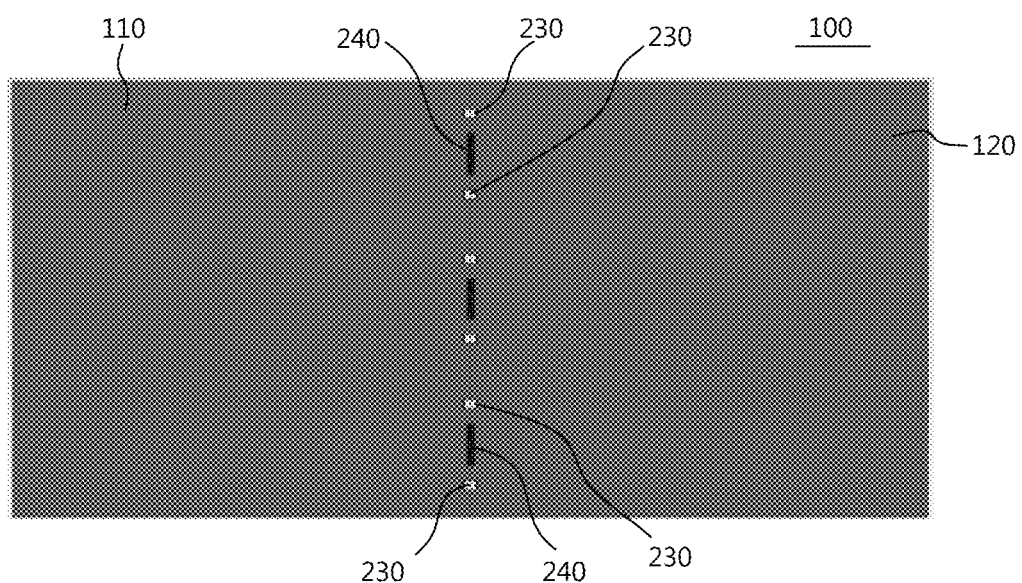
FIG. 3A shows an overall appearance of the board coupling structure in accordance with another embodiment of the inventive concept.
Figure 3B:
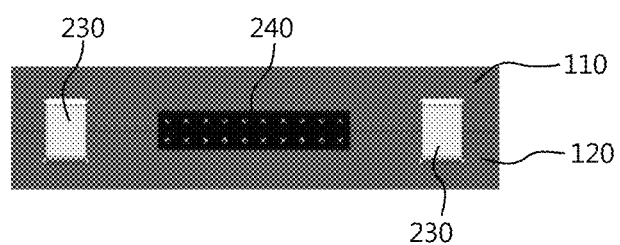
FIG. 3B is a plan view of coupling components.
Figure 3C:
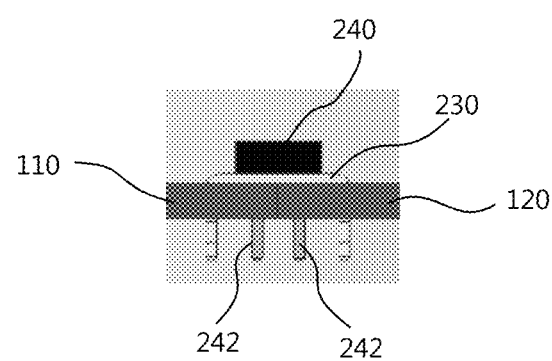
FIG. 3C is a side view of the coupling components.
Figure 3D:
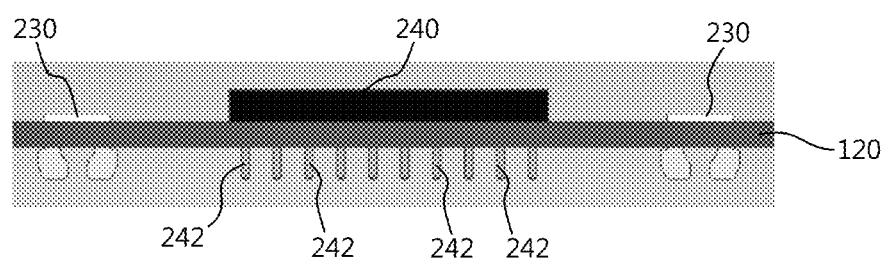
FIG. 3D is a front view of the coupling components.
Figure 3E:
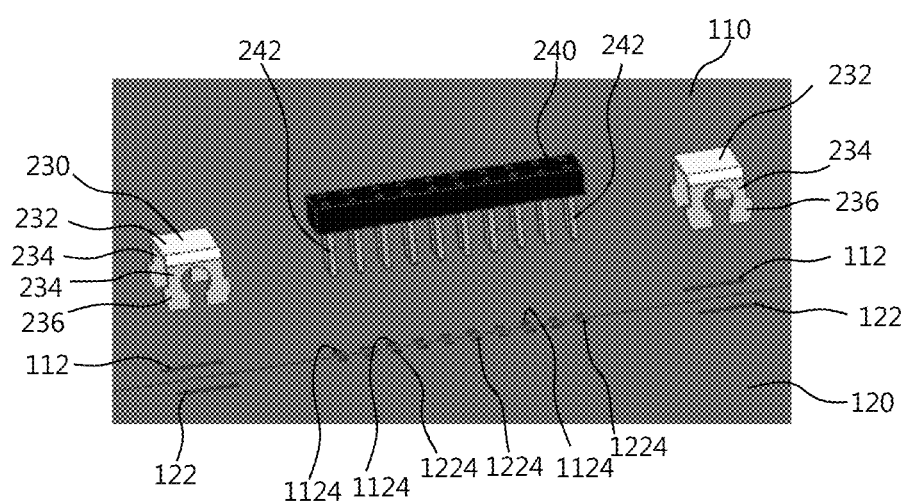
FIG. 3E is an exploded perspective view of the coupling components.

FIG. 3A shows an overall appearance of the board coupling structure, FIG. 3B is a plan view of coupling components, FIG. 3C is a side view of the coupling components, FIG. 3D is a front view of the coupling components, and FIG. 3E is an exploded perspective view of the coupling components.

Referring to FIG. 3, a board coupling structure 100 may include a first circuit board 110, which is a signal processing circuit board, for processing image signals and/or voice signals, a second circuit board 120, which is a power supply circuit board, fasteners 230 for physically coupling the two boards, and electrical connectors 240 (which may be formed as connector headers in the present embodiment) for electrically connecting the two boards.

Elements or modules for processing image signals and/or voice signals are disposed on the first circuit board 110 and the elements or modules are omitted for convenience of description.

The first circuit board 110 may be a PCB of three or more layers. In some cases, the first circuit board 110 may be a two-layer PCB.

First fastener insertion holes 112 for inserting the fasteners 230 may be formed in an edge, which faces the second circuit board, of the first circuit board 110.

Third connector insertion holes 1124 for inserting pins 242, which are located at the first circuit board, of the connector header 240 may be formed in the edge, which faces the second circuit board 120, of the first circuit board 110.

Elements or modules for providing necessary power to the first circuit board 110 are disposed on the second circuit board 120 and the elements or modules are omitted for convenience of description.

The second circuit board 120 may be a single-layer PCB or a two-layer PCB.

Second fastener insertion holes 122 for inserting the fasteners 230 may be formed in an edge, which faces the first circuit board 110, of the second circuit board 120.

Fourth connector insertion holes 1224 for inserting pins 242, which are located at the second circuit board, of the connector header 240 may be formed in the edge, which faces the first circuit board 110, of the second circuit board 120.

The fastener 230 may include an upper piece 232 crossing a boundary between the first circuit board 110 and the second circuit board 120, and two insertion pieces 234 which are bent and extend from opposite sides of the upper piece 232 and are inserted into the first fastener insertion hole 112 and the second fastener insertion hole 122.

The insertion piece 234 may be formed to have two legs in which an incised groove is formed at a central portion thereof, and locking steps 236 locking on one side of the first fastener insertion hole 112 and one side of the second fastener insertion hole 122 may be formed at ends of the insertion pieces 234.

The fastener 230 laterally fastens the first circuit board 110 to the second circuit board 120 to be pressed against each other from edge to edge.

The fastener 230 may be made of an elastic metal material.

The electrical connector 240 may be formed as a connector header which is inserted into and coupled to the third connector insertion holes 1124 and the fourth connector insertion holes 1224 facing each other.

The pins 242, which are located at the first circuit board, of the connector header 240 are electrically connected to the pins 242, which are located at the second circuit board, of the connector header 240.

The first circuit board 110 and the second circuit board 120 are electrically connected to each other through the connector header 240.

An assembly process of the board coupling structure in accordance with the present embodiment is as follows.

First, reflow soldering is performed on an upper surface of the first circuit board and reflow soldering is performed on an upper surface of the second circuit board.

Next, the circuit boards on which the reflow soldering is performed are mounted on a pallet, the fasteners and the connector header are assembled on each circuit board, and then flow soldering is performed.

Another assembly process of the board coupling structure in accordance with the present embodiment is as follows.

First, the first circuit board and the second circuit board are mounted on a pallet and then reflow soldering is performed.

Next, insertion components for the second circuit board are assembled, the fasteners and the connector header are assembled on each circuit board, and then flow soldering is performed.

FIG. 4 shows views for describing a board coupling structure in accordance with still another embodiment of the inventive concept.

Figure 4A:
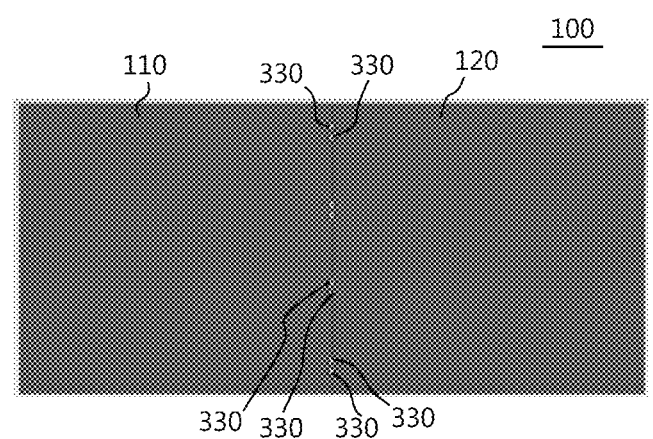
FIG. 4A shows an overall appearance of the board coupling structure in accordance with still another embodiment of the inventive concept.
Figure 4B:
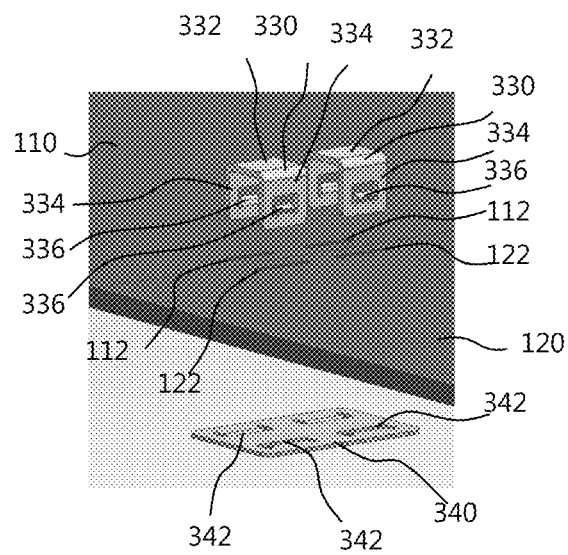
FIG. 4B is an exploded perspective view of coupling components.
Figure 4C:
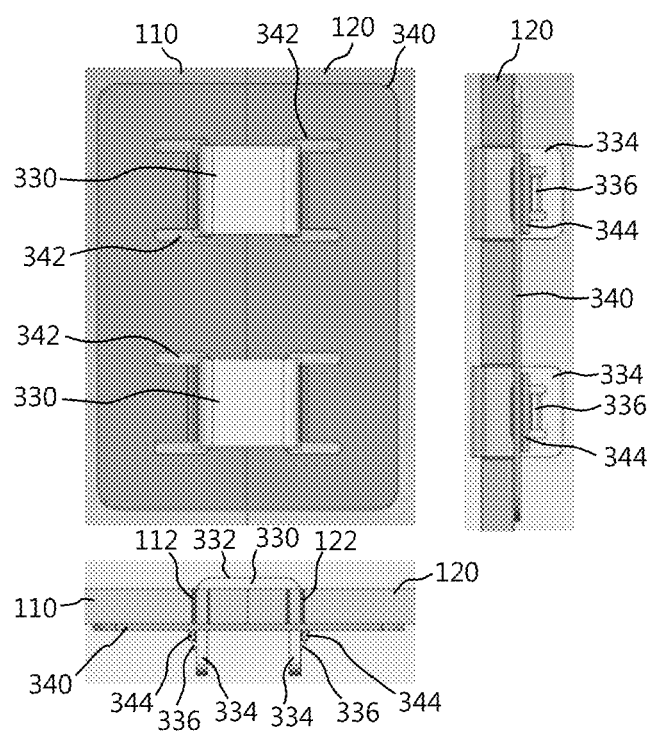
FIG. 4C is a layout comparison view of the coupling components.
Figure 4D:
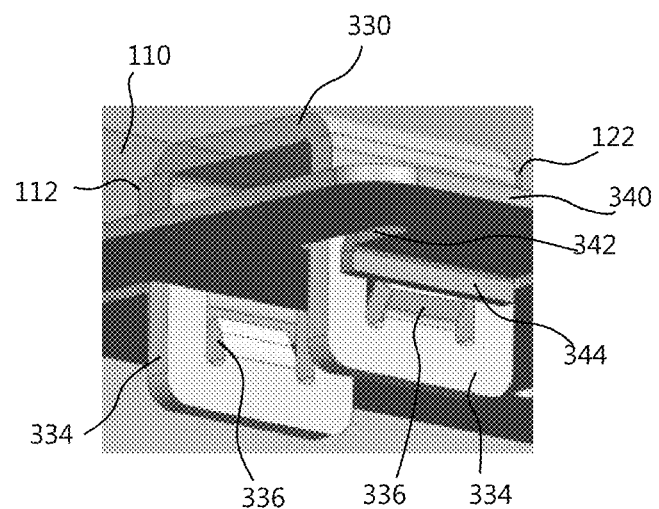
FIG. 4D is a perspective view of the coupling components.

FIG. 4A shows an overall appearance of the board coupling structure, FIG. 4B is an exploded perspective view of coupling components, FIG. 4C is a layout comparison view of the coupling components, and FIG. 4D is a perspective view of the coupling components.

Referring to FIG. 4, a board coupling structure 100 may include a first circuit board 110, which is a signal processing circuit board, for processing image signals and/or voice signals, a second circuit board 120, which is a power supply circuit board, fasteners 330 for physically coupling the two boards, and supports 340 for supporting the fasteners.

Elements or modules for processing image signals and/or voice signals are disposed on the first circuit board 110 and the elements or modules are omitted for convenience of description.

The first circuit board 110 may be a PCB of three or more layers. In some cases, the first circuit board 110 may be a two-layer PCB.

First fastener insertion holes 112 for inserting the fasteners 330 may be formed in an edge, which faces the second circuit board 120, of the first circuit board 110.

Elements or modules for providing necessary power to the first circuit board 110 are disposed on the second circuit board 120 and the elements or modules are omitted for convenience of description.

The second circuit board 120 may be a single-layer PCB or a two-layer PCB.

Second fastener insertion holes 122 for inserting the fasteners 330 may be formed in an edge, which faces the first circuit board 110, of the second circuit board 120.

The fastener 330 may include an upper piece 332 crossing a boundary between the first circuit board 110 and the second circuit board 120, and two insertion pieces 334 which are bent and extend from opposite sides of the upper piece 332, are inserted into the first fastener insertion hole 112 and the second fastener insertion hole 122, and are inserted into fastening holes 342 of the support.

The insertion piece 334 may be formed to have a detaching groove formed in a central portion thereof, and a locking bar 336 for being locked to a locking step 344 of the support may be formed below the detaching groove to extend upward.

The fastener 330 may be made of an elastic metal material or a synthetic resin material.

The support 340 may be formed to have a total of four fastening holes 342 so as to correspond to two fastening holes 342 per one fastener 330 in order to support the two fasteners 330 on lower surfaces of the first and second circuit boards.

The locking step 344 may be formed on one side of the fastening holes 342 to extend downward.

The fasteners 330 and the support 340 laterally fasten the first circuit board 110 to the second circuit board 120 to be pressed against each other.

The two fasteners 330 and one support 340 corresponding thereto may be referred to as a pair of fasteners.

Although an electrical connector is not shown in the embodiment of FIG. 4, components associated with the electrical connector 140 of FIG. 2 and/or components associated with the electrical connector 240 of FIG. 3 may be applied without changing.

The first circuit board 110 and the second circuit board 120 may also be electrically connected to each other through the electrical connector.

In the present embodiment, the electrical connector may be formed between a pair of fasteners.

Alternatively, the first circuit board and the second circuit board may be electrically connected through a general cable connection connector.

An assembly process of the board coupling structure in accordance with the present embodiment is as follows. This assembly process is a process for an example using a general cable connection connector.

First, reflow soldering is performed on an upper surface of the first circuit board and then reflow soldering is performed on an upper surface of the second circuit board.

Next, after insertion components are assembled on each of the circuit boards on which the reflow soldering is performed, flow soldering is performed.

Next, after the first circuit board and the second circuit board are fixed on a jig, the fasteners 330 and the support 340 are fixedly assembled on each circuit board.

Next, the first circuit board and the second circuit board are connected through a cable connection connector.

Another assembly process of the board coupling structure in accordance with the present embodiment is as follows. This assembly process is a process for an example using the electrical connector in FIG. 2.

First, after the socket 142 is mounted on the first circuit board, reflow soldering is performed on an upper surface of the first circuit board, and after the socket 142 is mounted on the second circuit board, reflow soldering is performed on an upper surface of the second circuit board.

Next, after insertion components are mounted on each of the circuit boards on which the reflow soldering is performed, flow soldering is performed.

Next, after the first circuit board and the second circuit board are fixed on a jig, the connector header, the fasteners 330, and the support 340 are assembled on each circuit board and fixed.

Still another assembly process of the board coupling structure in accordance with the present embodiment is as follows. This assembly process is a process for an example using the electrical connector in FIG. 3.

First, reflow soldering is performed on an upper surface of the first circuit board and reflow soldering is performed on an upper surface of the second circuit board.

Next, the circuit boards on which the reflow soldering is performed are mounted on a pallet, the connector header is assembled on each circuit board, and then flow soldering is performed.

Next, after the first circuit board and the second circuit board are fixed on a jig, the fasteners 330 and the support 340 are fixedly assembled on each circuit board.

In accordance with the present embodiment, yet another assembly process for an example using the electrical connector of FIG. 3 is as follows.

First, the first circuit board and the second circuit board are mounted on a pallet, and reflow soldering is performed.

Next, insertion components for the second circuit board are assembled, the connector headers for the two circuit boards are assembled, and then flow soldering is performed.

Next, after the first circuit board and the second circuit board are fixed on a jig, the fasteners 330 and the support 340 are fixedly assembled on each circuit board.

FIG. 5 shows views for describing a board coupling structure in accordance with yet another embodiment of the inventive concept.

FIGS. 5A to 5D show examples of different sizes and different coupling contact edge lines of a first circuit board 110 serving as a signal processing circuit board and a second circuit board 120 serving as a power supply circuit board.

Figure 5A:
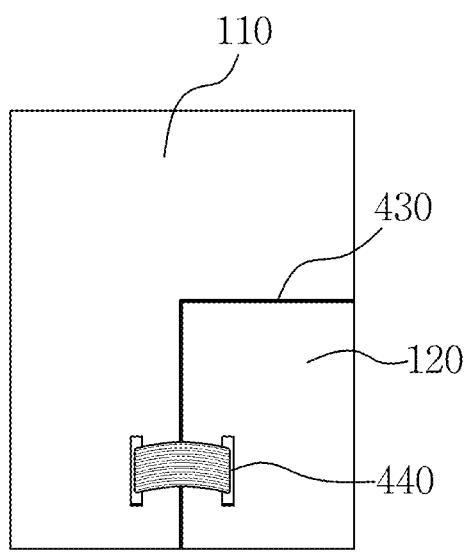
FIGS. 5A to 5D show views for describing a board coupling structure in accordance with yet another embodiment of the inventive concept.
Figure 5B:
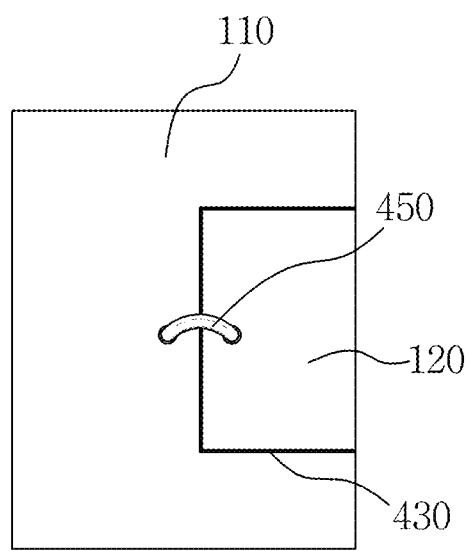

FIG. 5A shows a general harness connection using an electrical connector 440, and FIG. 5B shows a general cable connection using an electrical connector 450.

Figure 5C:
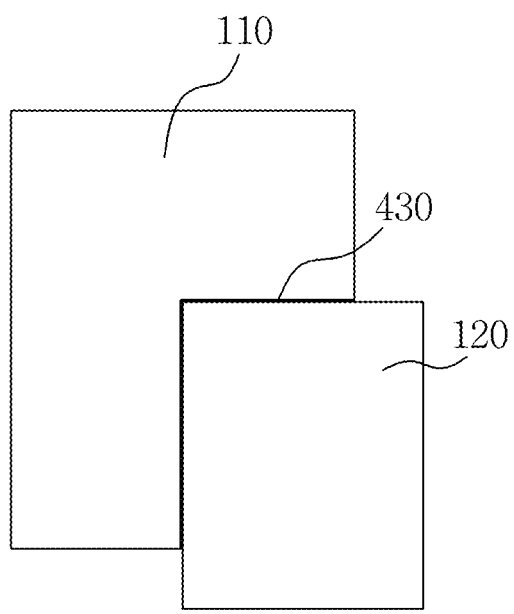
Figure 5D:
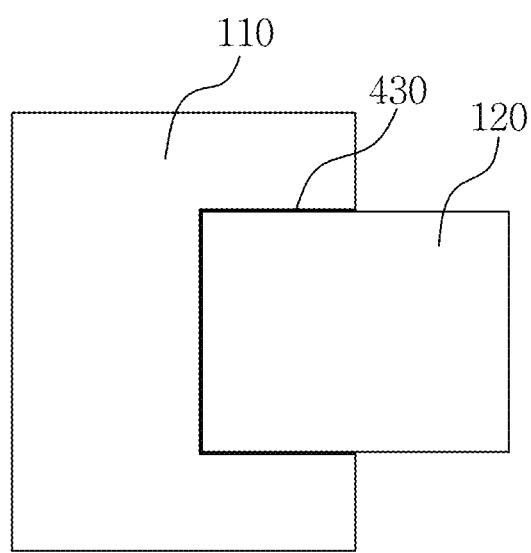

In FIGS. 5C and 5D, electrical connectors are omitted.

In FIGS. 5A to 5D, an adhesive 430, such as epoxy or silicone, is used as a fastening unit for each circuit board at contact edge lines facing each other between the circuit boards so that the respective circuit boards may be laterally fastened to be pressed against each other.

The example of FIG. 5 may further include the fasteners described in FIGS. 2 and 3 so that fastening force between the boards may be improved, and the adhesive may be used for the contact edge lines of the boards with respect to the embodiments described with reference to FIGS. 2 to 4 so that fastening force between the boards may be further improved.

In the inventive concept, the first circuit board and the second circuit board are fastened laterally and tightly using the fasteners and the electrical connector to be pressed against each other from edge to edge. Therefore, there is an advantage in that it is possible to provide convenience in use that allows two boards to be treated as one board.

In the inventive concept, the electrical connector is disposed between the fasteners or between the pair of fasteners. Therefore, it is possible to further improve fastening force between two boards by not only the fasteners but also the electrical connector.

While the embodiments of the inventive concept has been described above. The scope of the inventive concept is not limited to the above-described embodiments, and it may be understood by those skilled in the art that various modifications and alterations may be made without departing from the spirit and scope of the inventive concept described in the appended claims.

For example, in FIGS. 2 to 4, although the upper pieces of the fastener are described as being formed to cross the upper surface of the first circuit board and cross the upper surface of the second circuit board, the disposed fasteners are alternately disposed so that the upper pieces of the fastener may be formed to cross the upper surfaces of the boards and the upper pieces of the other fastener adjacent thereto may be formed to cross lower surfaces of the boards.

Further, instead of the electrical connectors described in FIGS. 2 and 3, through a general harness connection or a general cable connection, the boards may be electrically connected.

According to the inventive concept, the signal processing circuit board and the power supply circuit board are formed as different types of boards and the boards are coupled to each other to operate as a single board, and thus board production cost can be reduced and the boards can be easily installed and managed.

Further, a change in circuit layout or a change in area of one board according to a change in a circuit layout or a change in area of the other board can be unnecessary or can be minimized.

What is claimed is:

1. A board coupling structure comprising:
   a first circuit board;
   a second circuit board;
   at least one electrical connector configured to electrically connect the first circuit board to the second circuit board; and
   a fastener configured to be spaced apart from the electrical connector and to laterally fasten a contact edge of the first circuit board to a contact edge of the second circuit board which are facing each other,
   wherein the at least one electrical connector comprises a socket connected to the first circuit board and the second circuit board and a connector header on which a plurality of pins, which are inserted into pin through-holes formed in the socket, are formed.

2. The board coupling structure of claim 1, wherein:
   the socket comprises a first socket connected to the first circuit board and a second socket connected to the second circuit board; and
   the connector header is disposed at upper sides of the first socket and the second socket.

3. The board coupling structure of claim 2, wherein:
   a first pin through-hole is formed in the first socket;
   a second pin through-hole is formed in the second socket; and
   a first side pin to be inserted into the first pin through-hole and a second side pin to be inserted into the second pin through-hole are formed on the connector header.

4. The board coupling structure of claim 3, wherein the first side pin and the second side pin are electrically connected to each other.

5. The board coupling structure of claim 3, wherein:
   a pin formed on the first socket is inserted into a first socket insertion hole formed in the first circuit board; and
   a pin formed on the second socket is inserted into a second socket insertion hole formed in the second circuit board.

6. The board coupling structure of claim 5, wherein:
   the first side pin is inserted into a first connector insertion hole formed in the first circuit board; and
   the second side pin is inserted into a second connector insertion hole formed in the second circuit board.

7. The board coupling structure of claim 1,
   wherein the fastener includes:
   an upper piece configured to cross an upper or lower boundary between the first circuit board and the second circuit board;
   two insertion pieces which are bent and extend from opposite sides of the upper piece toward the boards and are inserted into a first fastener insertion hole formed in the first circuit board and into a second fastener insertion hole formed in the second circuit board; and
   a locking step formed at end of the insertion piece,
   wherein the locking step locks on one side of inserted hole.

8. The board coupling structure according to claim 7, wherein the fastener is provided with two or more fasteners spaced apart from each other,
   wherein, of the two or more fasteners, two fasteners are formed as a pair of fasteners and are supported by one support that crosses the upper or the lower boundary between the first circuit board and the second circuit board.

9. The board coupling structure according to claim 8, wherein the support includes four fastening holes into which the insertion pieces inserted into respective fastener insertion hole are inserted.

10. The board coupling structure according to claim 1, wherein the second circuit board is formed of a smaller number of layers than the number of layers of the first circuit board.

11. The board coupling structure according to claim 1, wherein:
   the first circuit board is a signal processing circuit board for processing an image signal and/or a voice signal; and
   the second circuit board is a power supply circuit board for supplying power to the first circuit board.

* * * * *